(12) United States Patent
Schrab

(10) Patent No.: US 8,724,342 B2
(45) Date of Patent: May 13, 2014

(54) SHIELD WITH RESILIENT SPRING SNAPS FOR REMOVABLE ATTACHMENT TO AN ELECTRICAL CIRCUIT BOARD WITHOUT THE USE OF ADHESIVE OR SOLDER

(75) Inventor: Lucas G. Schrab, Plainwell, MI (US)

(73) Assignee: Gentex Corporation, Zeeland, MI (US)

( * ) Notice: Subject to any disclaimer, the term of this patent is extended or adjusted under 35 U.S.C. 154(b) by 80 days.

(21) Appl. No.: 13/426,311

(22) Filed: Mar. 21, 2012

(65) Prior Publication Data

US 2013/0250534 A1    Sep. 26, 2013

(51) Int. Cl.
 H05K 9/00   (2006.01)
 H05K 1/02   (2006.01)

(52) U.S. Cl.
 CPC ............ *H05K 9/0032* (2013.01); *H05K 9/0039* (2013.01); *H05K 1/0218* (2013.01); *H05K 2201/10371* (2013.01)
 USPC .......................................... 361/816; 361/818

(58) Field of Classification Search
 CPC . H05K 9/0032; H05K 9/0039; H05K 1/0218; H05K 2201/10371; H05K 9/0016; H05K 9/0062; G06F 1/182; H01L 23/552
 USPC .......... 361/816, 818; 174/354, 359, 360, 367, 174/372
 See application file for complete search history.

(56) References Cited

U.S. PATENT DOCUMENTS

| | | | |
|---|---|---|---|
| 3,338,689 A * | 8/1967 | Cervenka et al. | ............. 428/571 |
| 5,508,889 A | 4/1996 | Ii | |
| 5,557,063 A | 9/1996 | Mottahed | |
| 5,717,577 A | 2/1998 | Mendolia et al. | |
| 6,060,659 A | 5/2000 | Borowiec et al. | |
| 6,239,359 B1 | 5/2001 | Lilienthal, II et al. | |
| 6,266,877 B1 | 7/2001 | Borowiec et al. | |
| 6,377,472 B1 * | 4/2002 | Fan | ................................ 361/800 |
| 6,687,135 B1 | 2/2004 | Kitade | |
| 6,729,905 B1 | 5/2004 | Hwang | |
| 6,872,880 B2 | 3/2005 | King et al. | |
| 6,930,891 B1 * | 8/2005 | Hama et al. | ................... 361/800 |
| 6,979,773 B2 | 12/2005 | Fursich | |
| 7,095,626 B2 * | 8/2006 | Seidler | .......................... 361/816 |
| 7,277,301 B2 | 10/2007 | Liang | |
| 2002/0166683 A1 | 11/2002 | Shlahtichman et al. | |
| 2011/0299262 A1 * | 12/2011 | Crotty | ............................. 361/818 |
| 2012/0044663 A1 * | 2/2012 | Lu et al. | ......................... 361/818 |

FOREIGN PATENT DOCUMENTS

EP       1942713 A1      7/2008

OTHER PUBLICATIONS

Patent Cooperation Treaty, International Searching Authority, International Search Report, Written Opinion of the International Searching Authority, Jun. 14, 2013, 7 pages.

MAJR Products, "Custom Board Level Shielding (5300 Series)," date unknown, pp. 56-58.

* cited by examiner

*Primary Examiner* — Jenny L Wagner
*Assistant Examiner* — Michael P McFadden
(74) *Attorney, Agent, or Firm* — Price Heneveld LLP; Scott P. Ryan

(57) ABSTRACT

A cover shield for a circuit board having a body. A peripheral wall is disposed about an edge of the body. First and second slots each include a first portion that extends through the body and a second portion that extends through the peripheral wall. A barbed tab is disposed between the first and second slots. A notch extends through a portion of the barbed tab. A distinct abutting member is disposed on the peripheral wall.

20 Claims, 7 Drawing Sheets

SHIELD WITH RESILIENT SPRING SNAPS FOR REMOVABLE ATTACHMENT TO AN ELECTRICAL CIRCUIT BOARD WITHOUT THE USE OF ADHESIVE OR SOLDER

BACKGROUND OF THE INVENTION

The present invention generally relates to a shield, and more specifically, to a shield with resilient spring snaps for removable attachment to an electrical circuit board without the use of adhesive or solder.

SUMMARY OF THE PRESENT INVENTION

One aspect of the present invention includes a cover shield for a circuit board. The cover shield includes a body and a peripheral wall disposed about an edge of the body. First and second slots are provided and each includes a first portion that extends through the body and a second portion that extends through the peripheral wall. A barbed tab is disposed between the first and second slots. A distinct abutting member is disposed on the peripheral wall.

Another aspect of the present invention includes a connecting arrangement for engagement with a substrate. The connecting arrangement includes a body and a plurality of peripheral wall sections disposed about an edge of the body. A plurality of slots are provided, each of which includes a first portion that extends through the body and a second portion that extends through the peripheral wall. A tab extends from the body and includes a first catch and a second catch that are separated by a notch extending at least partially through the tab.

Yet another aspect of the present invention includes a circuit board and cover shield assembly having a circuit board with first and second sides and an engagement hole extending therethrough. A cover shield is provided and includes a body and a plurality of peripheral wall sections are disposed about an edge of the body. First and second slots each includes a first portion that extends through the body and a second portion that extends through the peripheral wall. A barbed tab is disposed between the first and second slots and include an engagement portion and a flex portion. The barbed tab is adapted to penetrate the engagement hole such that the barbed tab frictionally engages the second side of the circuit board, causing a tension force on the barbed tab and simultaneously causing a compression force between a spring member and the first side of the circuit board.

These and other aspects, objects, and features of the present invention will be understood and appreciated by those skilled in the art upon studying the following specification, claims, and appended drawings.

DETAILED DESCRIPTION OF EMBODIMENTS

Figure 1:
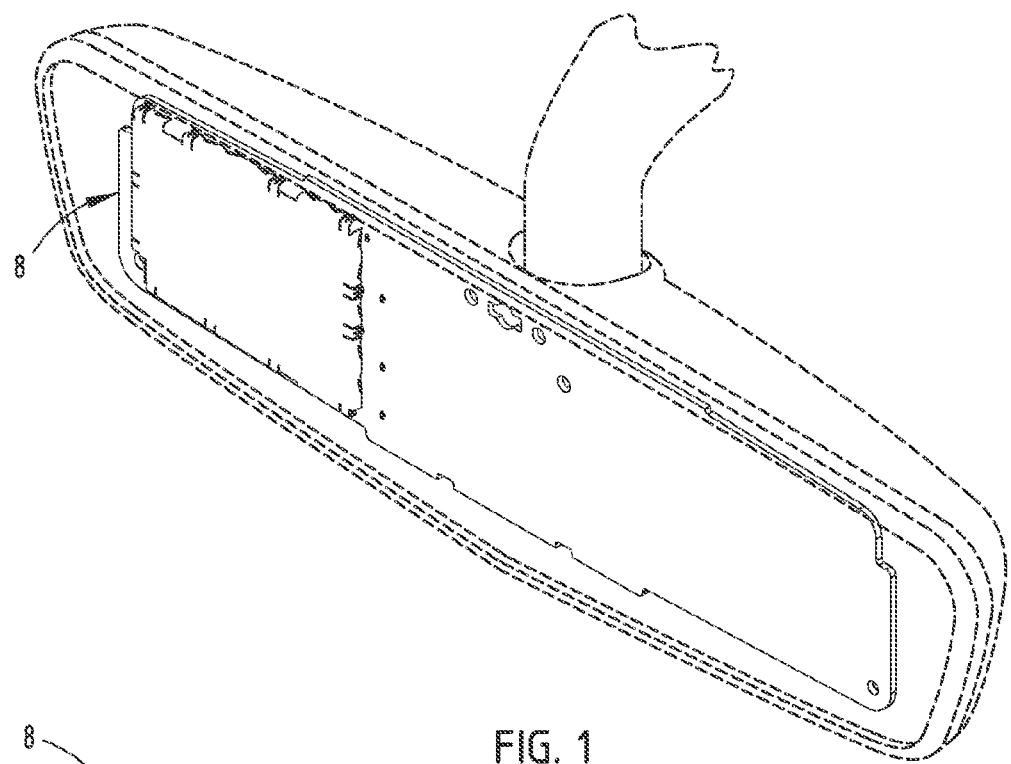
FIG. 1 is a top perspective view of a rearview device incorporating one embodiment of a cover shield and circuit board assembly of the present invention.
Figure 2:
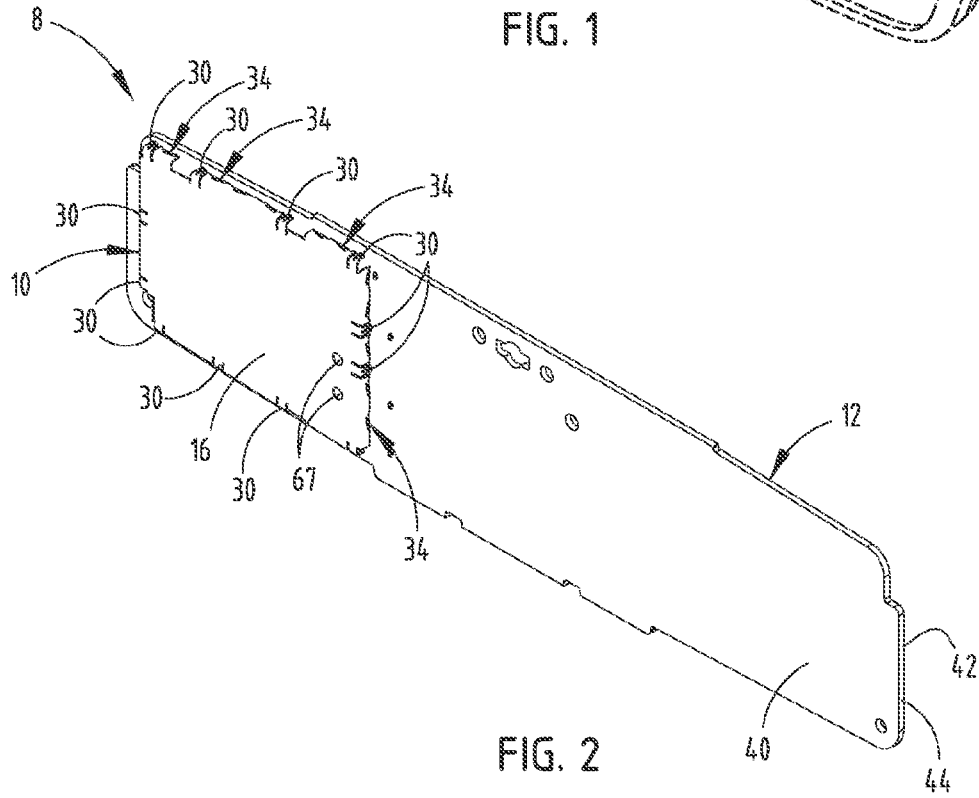
FIG. 2 is a top perspective view of the cover shield and circuit board assembly of FIG. 1.
Figure 3:
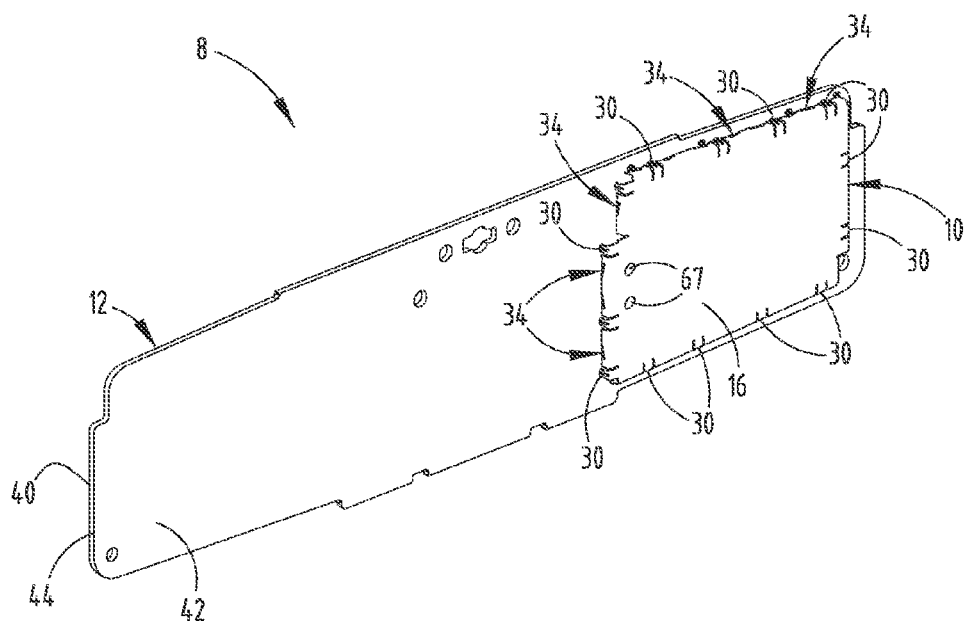
FIG. 3 is a rear perspective view of the cover shield and circuit board assembly of FIG. 1.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Referring to FIGS. 1-9B, reference numeral 8 generally designates a cover shield and circuit board assembly having a cover shield 10 adapted for coupling to a circuit board 12. The cover shield 10 includes a body 14 and a peripheral wall 16 disposed about an edge 18 of the body 14. A plurality of slots 20A, 20B each include a first portion 24 that extends through the body 14 and a second portion 26 that extends through the peripheral wall 16. A tab 30 is disposed between predetermined pairs of the plurality of slots 20A, 20B. A notch 32 extends through a portion of the tab 30. A distinct abutting member 34 is disposed on the peripheral wall 16.

Referring now to FIGS. 1-5, the cover shield 10 is generally designed as an electromagnetic or radio frequency shielding device for use on circuit boards 12. However, it is contemplated that the cover shield 10 could be used in a variety of capacities to protect circuitry disposed on the circuit board 12 or on other substrates that include sensitive surface areas that are prone to damage. The cover shield 10 effectively reduces the electromagnetic field in and around the circuit board 12 by blocking the electromagnetic field by way of the conductive body 14 of the cover shield 10. Accordingly, the body 14 of the cover shield 10 blocks radio frequency electromagnetic radiation that could alter, damage, or destroy sensitive circuitry disposed on the circuit board 12. It is contemplated that the cover shield 10 could be made of any number of suitable materials, including metal foams, sheet metal, and metal screens. It is also contemplated that the cover shield 10 may be constructed from a plastic material that is covered by a metallic ink or a metallic coating. The cover shields 10 can be applied to a first side 40 and a second side 42 of a substrate 44 of the circuit board 12 in the manner disclosed herein, and are not limited to coupling with only one side of the circuit board 12. It will be understood by one having ordinary skill in the art that the cover shield 10 may be of a variety of constructions and may take on a configuration of a connecting arrangement for engagement with a substrate.

Figure 5:
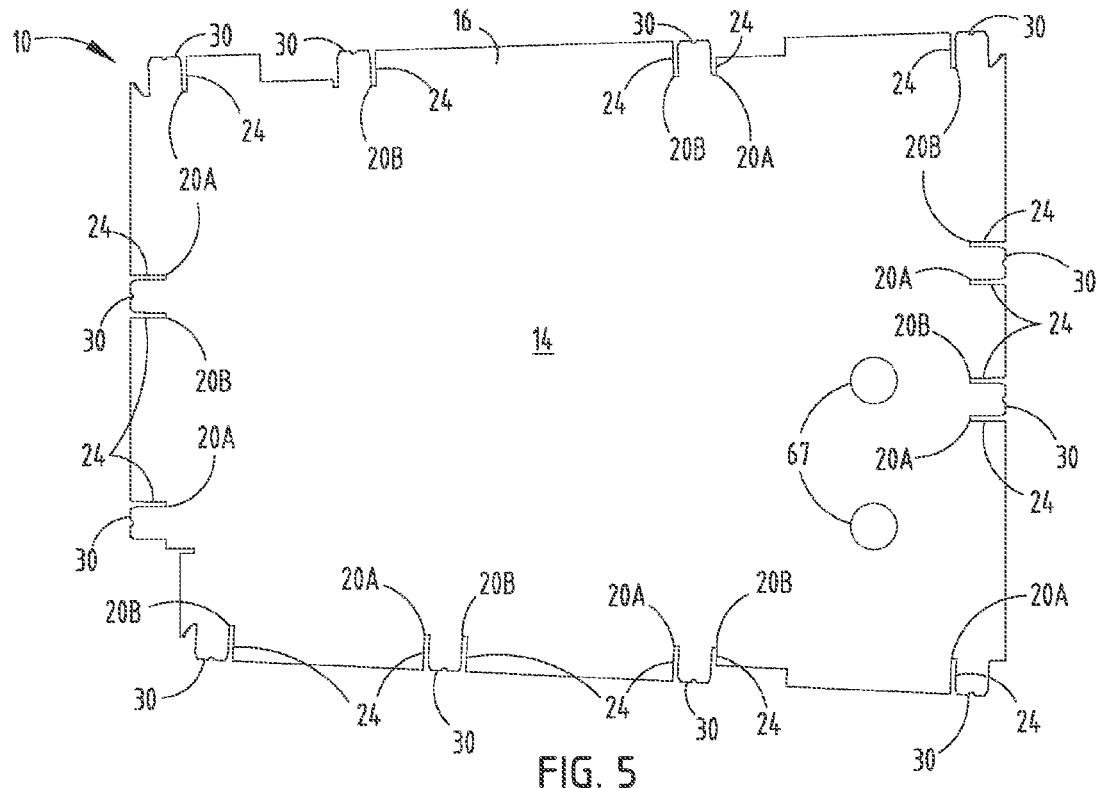
FIG. 5 is a front elevational view of one embodiment of a cover shield of the present invention.
Figure 6:
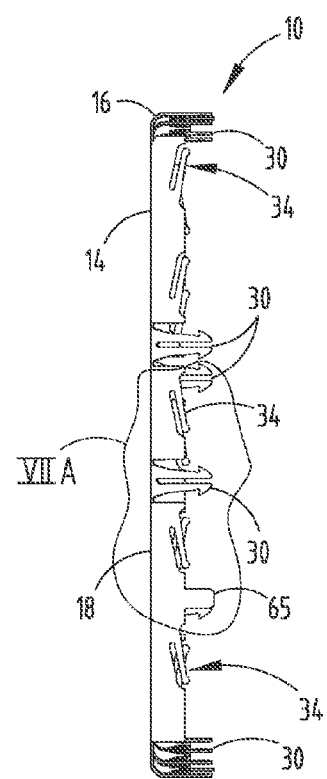
FIG. 6 is a side elevational view of one embodiment of a cover shield of the present invention.
Figure 8A:
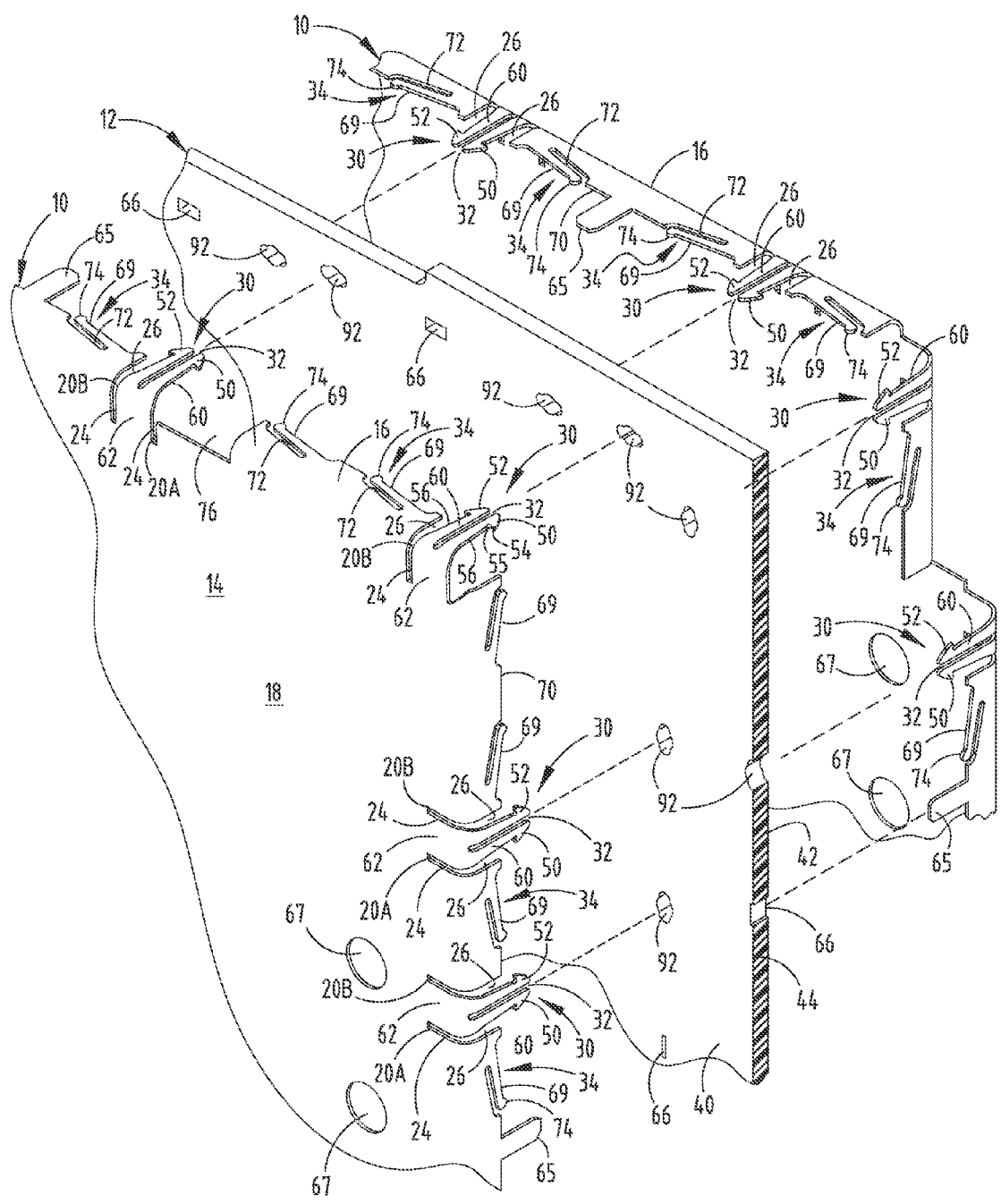
FIG. 8A is a top perspective view of the cover shield of FIG. 5 prior to installation into a circuit board.

With reference to FIGS. 5 and 8A, and as noted above, each of the plurality of slots 20A, 20B extends from the first portion 24 on the body 14 to the second portion 26 on the peripheral wall 16. Accordingly, each of the plurality of slots 20A, 20B has an L-shaped configuration. Notably, some tabs 30 include both slots 20A and 20B, while other tabs 30 include only one slot 20A or one slot 20B. Those tabs 30 that include only one slot 20A or 20B are generally disposed adjacent an absence of material in the body 14 of the cover shield 10, such that flexure of the tab 30 during installation is not hindered. The tabs 30 define separate sections in the peripheral wall 16.

As illustrated in FIGS. 4-7B, the tab 30 is barbed and the notch 32 extends substantially through a center portion of the tab 30. It is contemplated that the notch 32 may be offset such that the notch 32 does not extend centrally through the tab 30. The notch 32 through the tab 30 defines a first catch 50 and a second catch 52 that are designed to engage the substrate 44 (FIGS. 8A and 8B) to which the cover shield 10 is attached after assembly. The first catch 50 and second catch 52 both include an engagement surface 54 that may be substantially coplanar with the second side 42 of the substrate 44 or may be acutely angled such that the first catch 50 and second catch 52 grab the second side 42 of the substrate 44. In the illustrated embodiment, an arcuate cutout 55 is disposed between an outside edge 56 of the tab 30 and the engagement surface 54. The cutout 55 may include a radius. The first catch 50 and second catch 52 define an engagement portion 60 of the tab 30, which is adapted to extend into and through the substrate 44 (FIGS. 8A and 8B) and contact the second side 42 (FIGS. 8A and 8B) of the substrate 44 (FIGS. 8A and 8B). The tab 30 also includes a flex portion 62 that serves as an intermediary between the engagement portion 60 and the body 14 of the cover shield 10. As illustrated, the planar extent of the engagement portion 60 is substantially orthogonal relative to the planar extent of the flex portion 62. However, it is contemplated that the planar extent of the engagement portion 60 and flex portion 62 could be oriented at almost any angle relative to one another. The flex portion 62 is adapted to flex or adjust under pressure to maintain the cover shield 10 in tight or snug compliance with the substrate 44. The plurality of slots 20A, 20B extend across both the peripheral wall 16 and the body 14 of the cover shield 10. Because the plurality of slots 20A, 20B extend onto the body 14 of the cover shield 10, the entire tab 30 is allowed to flex downward via the flex portion 62 such that the cover shield 10 can maintain biased engagement with the substrate 44 of the circuit board 12. As illustrated, the cover shield 10 includes an alignment pin 65 that engages an alignment hole 66 in the substrate 44 to ensure proper alignment of the cover shield 10 with the substrate 44 during installation. Access holes 67 are provided in the substrate 44 so that the tab 30 on the cover shield 10 disposed on the other side of the substrate 44 can be disengaged from the substrate 44, if necessary. The alignment pins 65 also stabilize the cover shield 10 when the cover shield 10 is subjected to lateral forces, thereby minimizing the likelihood that the cover shield 10 will detach from the substrate 44.

Figure 7A:
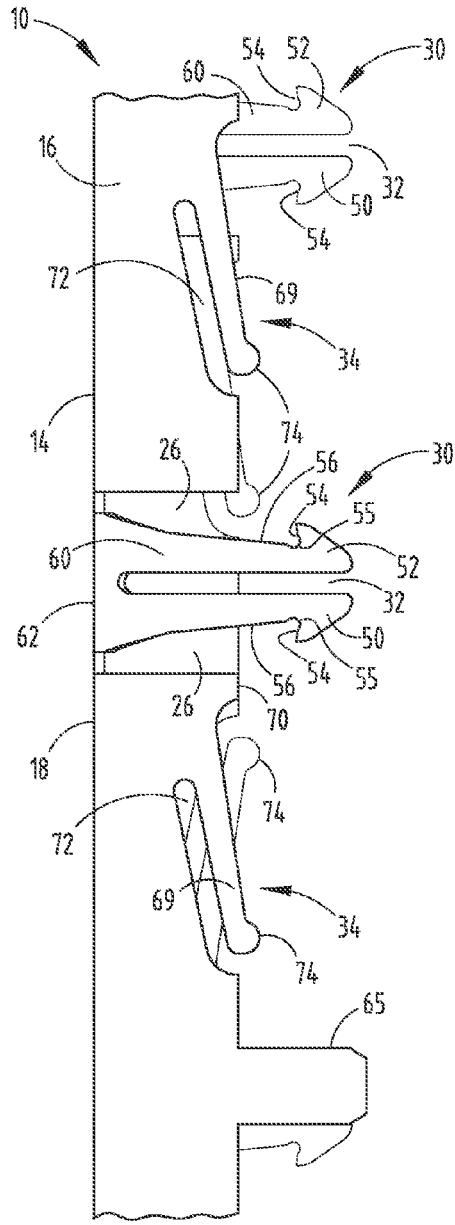
FIG. 7A is an enlarged elevational view of area VIB of FIG. 6.
Figure 8B:
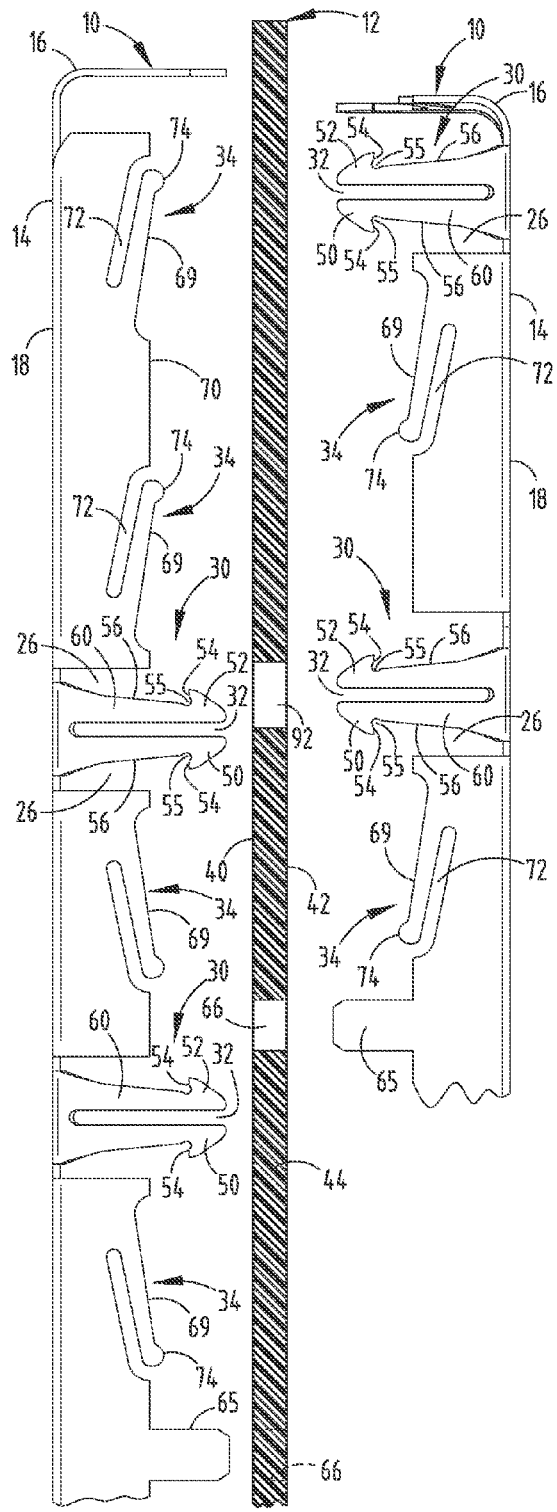
FIG. 8B is a side elevational view of the cover shield of FIG. 8A.

Referring now to FIG. 7A, the distinct abutting member 34 is in the form of a spring member 69 that extends from a peripheral edge 70 of the peripheral wall 16. The distinct abutting member 34 extends substantially parallel with the peripheral edge 70 and substantially parallel with the first side 40 of the substrate 44 of the circuit board 12. The distinct abutting member 34 is designed to flex against the first side 40 of the substrate 44 of the circuit board 12 during installation of the cover shield 10 onto the substrate 44. As the distinct abutting member 34 flexes, the distinct abutting member 34 begins to move into a gap 72 disposed between a bulbous distal end 74 of the distinct abutting member 34 and the peripheral wall 16. The distinct abutting member 34 includes the bulbous distal end 74 that provides a contact area for the distinct abutting member 34 on the first side 40 of the substrate 44 of the circuit board 12. As illustrated in FIG. 8A, the cover shield 10 also includes an access aperture 76 disposed in the body 14. The access aperture 76 may be used for any of a variety of purposes, such as providing communication of a power line to the circuit board 12, providing a data connection between the circuit board 12 and an accessory, controller, etc., or providing clearance to other components.

Figure 7B:
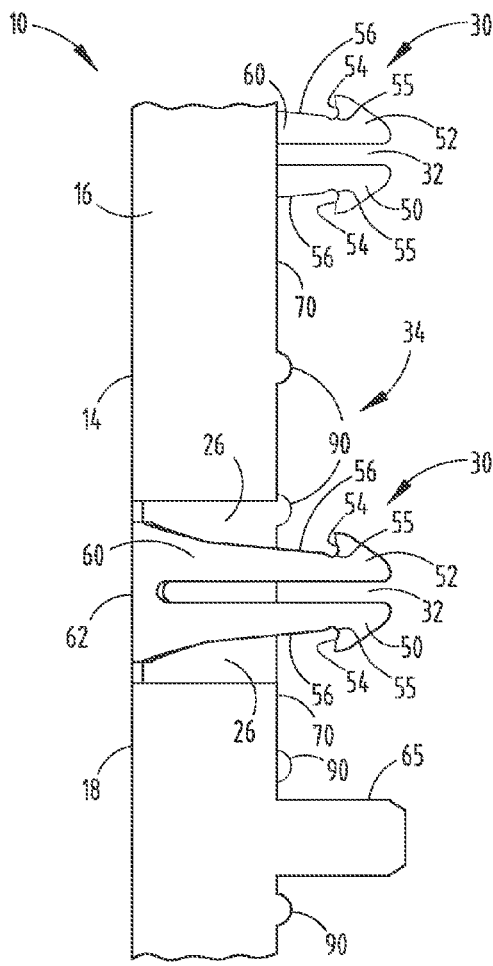
FIG. 7B is a side elevational view of another embodiment of a cover shield of the present invention.

In another embodiment, as shown in FIG. 7B, a plurality of distinct abutting members 34 in the form of bulbous contact members 90 are disposed on the peripheral edge 70 of the peripheral wall 16. The spaced bulbous contact members 90 provide some limited flexibility, while maintaining abutting contact with the first side 40 of the substrate 44 of the circuit board 12. The spaced bulbous contact members 90 provide an interface surface between the first side 40 of the substrate 44 and the body 14 of the cover shield 10. The embodiment of FIG. 7B also includes alignment pins 65 that assist in stabilizing the cover shield 10 on the substrate 44. The alignment pins 65 minimize the potential for the cover shield 10 to snap off of the substrate 44 when forces that are parallel with the planar extent of the substrate 44 are applied to the cover shield 10.

Figure 7C:
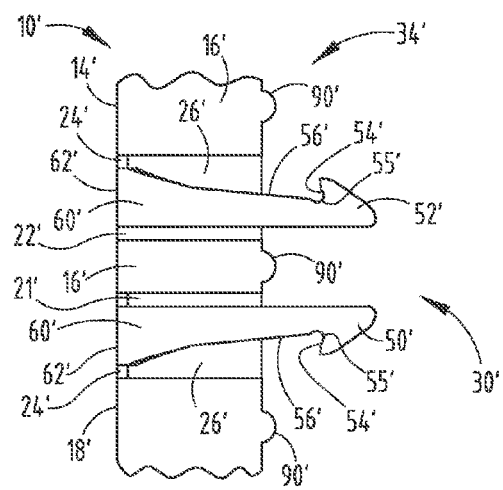
FIG. 7C is a side elevational view of yet another embodiment of a cover shield of the present invention.

In yet another embodiment, as shown in FIG. 7C, a cover shield 10' is illustrated that includes a first catch 50' and a second catch 52' adapted for connection with the substrate 44. The first catch 50' and the second catch 52' are separated by a short segment 17' of a peripheral wall 16'. A peripheral edge 70' on the peripheral wall 16' includes a bulbous contact member 90' for abutting the substrate 44 of the circuit board 12. The cover shield 10' has a body 14' that is integrally connected with the peripheral wall 16'. A slot 21' is located between the first catch 50' and the segment 17'. A slot 22' is located between the second catch 52' and the segment 17'. Each of the catches 50' and 52' include an engagement portion 60' and a flex portion 62'. The construction of the cover shield 10' otherwise has many similar features to those shown and described with regard to FIGS. 7A and 7B. These features are denoted by a reference numeral previously utilized in relation to one of the previous embodiments, but, with respect to this embodiment, includes the prime symbol "'".

Referring now to FIGS. 8A and 8B, during manufacture, one or more cover shields 10 are aligned with pre-tapped engagement holes 92 disposed in the substrate 44 of the circuit board 12. More specifically, the tabs 30 are aligned with the engagement holes 92 that extend through the substrate 44 of the circuit board 12. The cover shields 10 are then forced against the substrate 44, such that the first catch 50 and second catch 52 of each tab 30 are compressed toward one another, thereby narrowing the notch 32. In this condition, the first catch 50 and second catch 52 remain spring-biased to an outward position until the engagement surface 54 of each of the first catch 50 and second catch 52 passes the second side 42 of the substrate 44. When the engagement surface 54 of each of the first catch 50 and second catch 52 passes the planar extent of the second side 42 of the substrate 44, the first catch 50 and second catch 52 spring away from one another, such that the engagement surface 54 is in abutting contact with the second side 42 of the substrate 44 in secure engagement therewith. At the same time, the distinct abutting member 34 or bulbous contact member 90 (FIG. 7B) is pressed against the first side 40 of the substrate 44, such that there is a compression force between the distinct abutting member 34 and the first side 40 of the substrate 44.

Figure 9B:
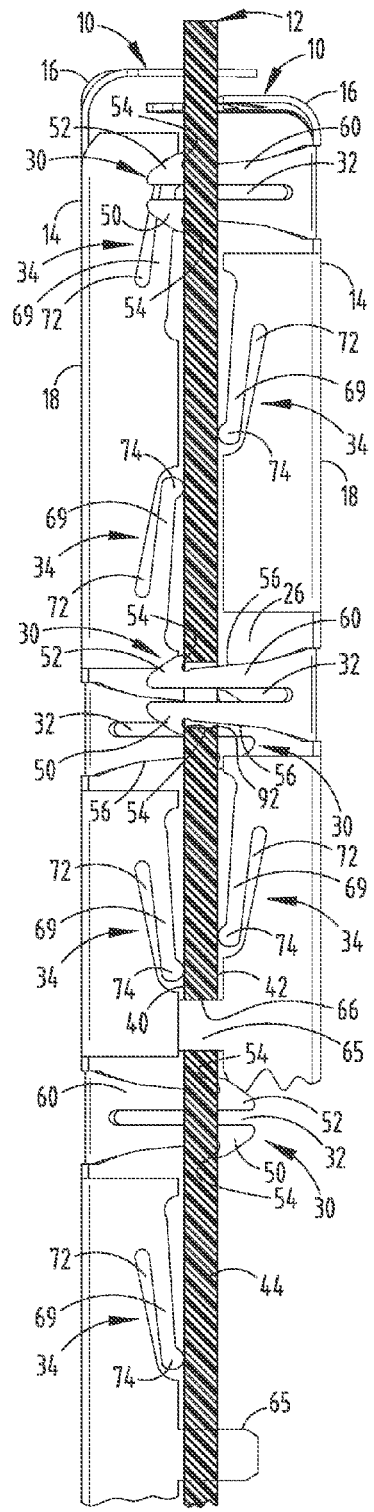
FIG. 9B is a side elevational view of the cover shield of FIG. 5 after installation into a circuit board.
Figure 9A:
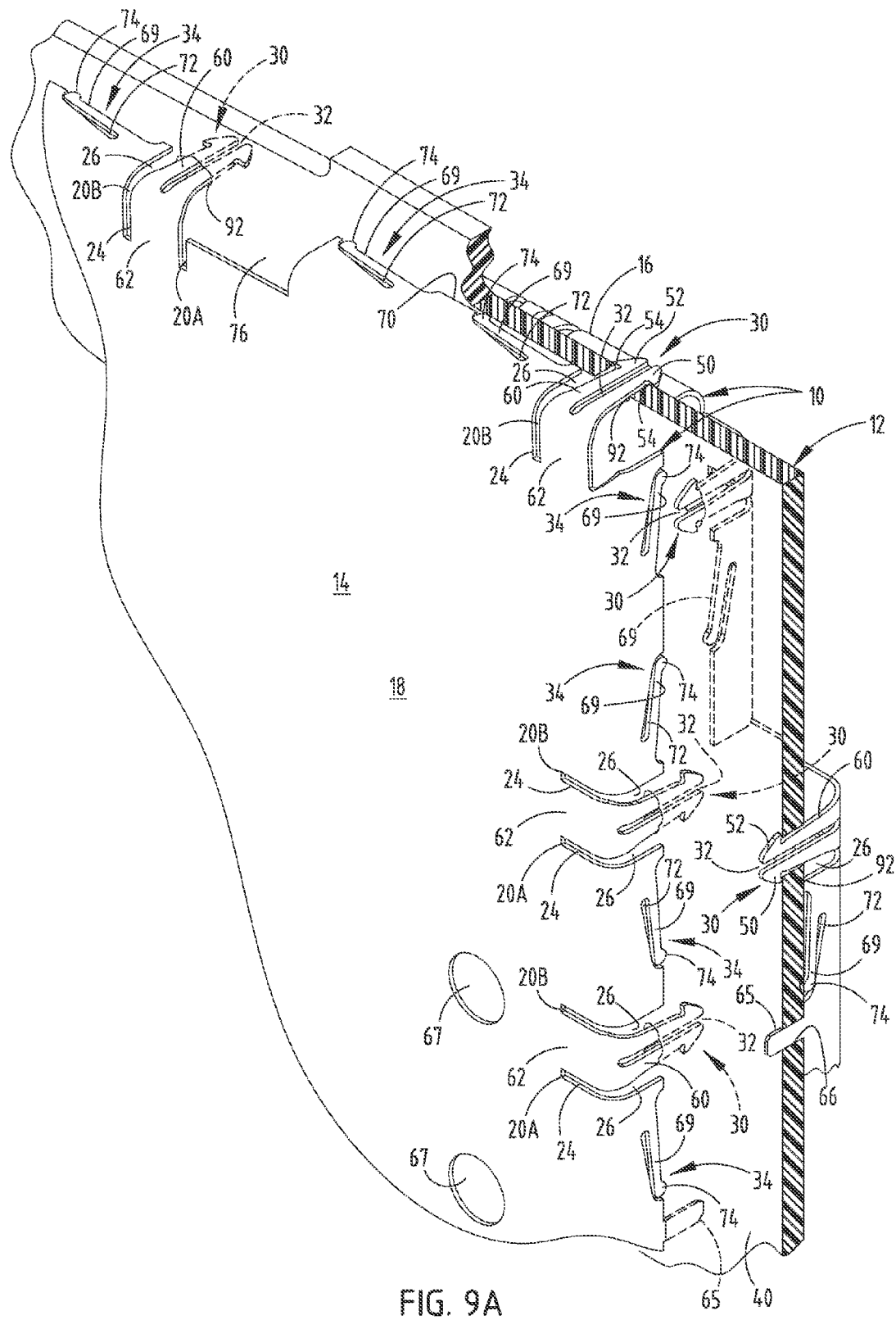
FIG. 9A is a top perspective view of the cover shield of FIG. 5 after installation into a circuit board.

Referring now to FIGS. 9A and 9B, after the cover shield 10 has been installed, the cover shield 10 compresses the substrate 44 by way of the flex portion 62 of the tab 30 and the distinct abutting member 34. Accordingly, secure engagement of the cover shield 10 to the substrate 44 of the circuit board 12 is maintained. The construction and assembly procedure, as outlined above, minimizes buzz, squeak, and rattle (BSR) concerns, and provides a non-solderable manufacturing technique, which increases the rate of assembly and minimizes production failure on assembly lines. This construction is useful for a variety of applications in which extensive dynamic loading is applied to the cover shield and circuit board assembly 8, such as in rearview devices installed inside and outside vehicles.

Figure 4:
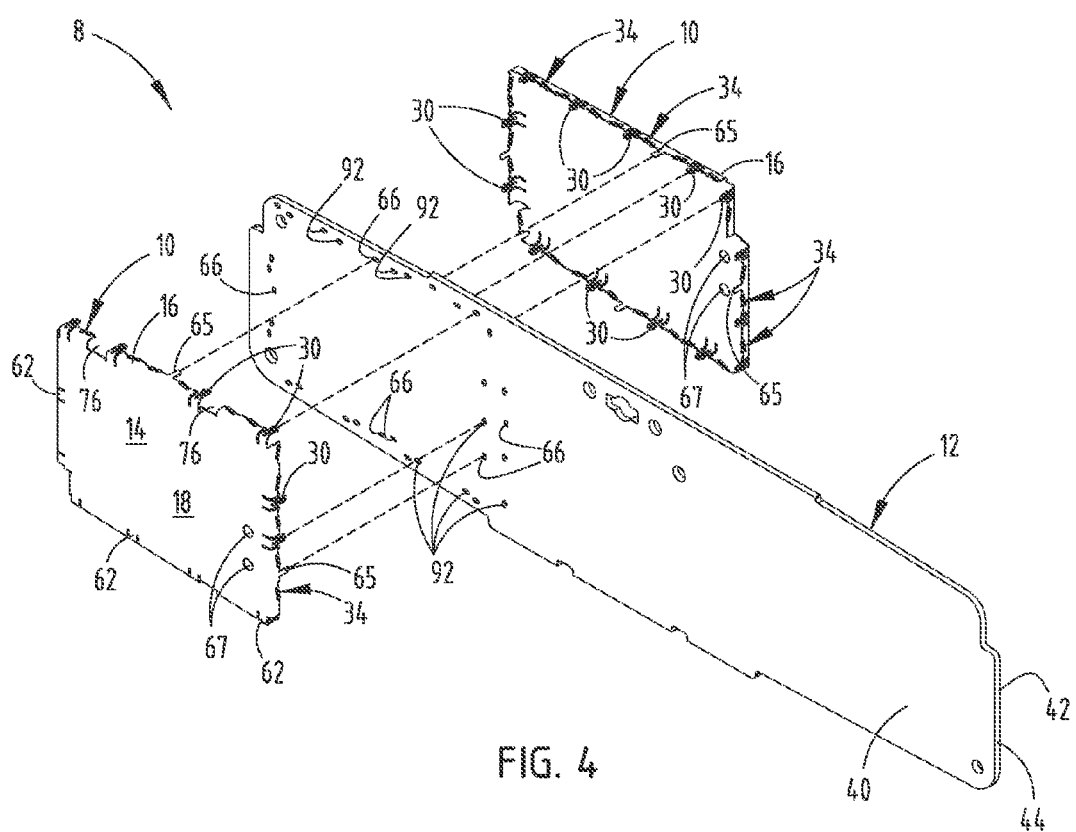
FIG. 4 is an exploded top perspective view of the cover shield and circuit board assembly of FIG. 1.

Notably, as shown in FIG. 4, one or more cover shields 10 may be applied to any substrate 44 to protect various portions of the circuit board 12. The cover shields 10 are designed to penetrate the engagement holes 92 in the substrate 44 such that the tabs 30 can frictionally engage the second side 42 of the circuit board 12. Engagement of the tabs 30 with the second side 42 of the circuit board 12 results in a tension force on the tab 30, and simultaneously causes a compression force between the distinct abutting member 34 or bulbous contact member 90 (FIG. 7B) and the first side 40 of the circuit board 12. Accordingly, the cover shield 10 is maintained in a substantially fixed position relative to the substrate 44 without the need for soldering or additional mechanical assembly that may include fasteners.

It will be understood for each of the aforementioned embodiments illustrated in FIGS. 1-9B that other constructions could also be utilized. It will also be understood that features of every embodiment disclosed herein may be used in conjunction with other embodiments disclosed herein or incorporated by reference and not specifically discussed. The disclosed embodiments are to be construed as examples and are not to be construed as limiting.

It will also be understood by one having ordinary skill in the art that construction of the described invention and other components is not limited to any specific material. Other exemplary embodiments of the invention disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the invention as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the other exemplary embodiments without departing from the spirit of the present innovations.

It will be understood that any described processes or steps within described processes may be combined with other disclosed processes or steps to form structures within the scope of the present invention. The exemplary structures and processes disclosed herein are for illustrative purposes and are not to be construed as limiting.

It is also to be understood that variations and modifications can be made on the aforementioned structures and methods without departing from the concepts of the present invention, and further it is to be understood that such concepts are intended to be covered by the following claims unless these claims by their language expressly state otherwise.

What is claimed is:

1. A cover shield for a circuit board comprising:
a body;
a peripheral wall disposed about an edge of the body;
first and second slots, each of which includes a first portion that extends through the body and a second portion that extends through the peripheral wall;
a barbed tab disposed between and at least partially defined by the first and second slots, a notch extending through a center portion of the barbed tab; and
a distinct abutting member disposed on the peripheral wall.

2. The cover shield of claim 1, wherein the distinct abutting member is generally defined as a bulbous contact member projecting from the peripheral wall.

3. The cover shield of claim 1, wherein the distinct abutting member is generally defined as a spring member, and wherein a gap is disposed between a distal end of the spring member and the peripheral wall.

4. The cover shield of claim 3, further comprising:
a bulbous portion disposed on the distal end of the spring member.

5. The cover shield of claim 1, wherein the barbed tab includes a first catch and a second catch adapted to engage a substrate.

6. The cover shield of claim 5, wherein the first catch and the second catch include an acutely angled engagement surface.

7. The cover shield of claim 1, wherein the barbed tab includes an engagement portion that is substantially coplanar with the peripheral wall.

8. The cover shield of claim 1, wherein the barbed tab includes a flex portion that is substantially coplanar with the body.

9. The cover shield of claim 1, wherein the barbed tab includes first a second opposing catches.

10. A connecting arrangement for engagement with a substrate comprising:

a body;

a plurality of peripheral wall sections disposed about an edge of the body;

a pair of slots, wherein each slot includes a first portion that extends through the body and a second portion that extends through the peripheral wall; and a tab extending from the body between the slots, the tab including first and second opposing catches separated by a notch extending at least partially through the tab.

11. The connecting arrangement of claim 10, wherein the tab includes an engagement portion that is substantially coplanar with the peripheral wall.

12. The connecting arrangement of claim 10, wherein the tab includes a flex portion that is substantially coplanar with the body.

13. The connecting arrangement of claim 10, further comprising:

a spring member disposed adjacent the tab.

14. The connecting arrangement of claim 13, further comprising:

a gap disposed between a distal end of the spring member and the peripheral wall.

15. The connecting arrangement of claim 10, further comprising:

a peripheral edge that includes spaced bulbous contact members.

16. A circuit board and cover shield assembly, comprising:

a circuit board having first and second sides and including an engagement hole extending therethrough; and a cover shield comprising:
 a body;
 a plurality of peripheral wall sections disposed about an edge of the body;
 first and second slots, each of which includes a first portion that extends through the body and a second portion that extends through the peripheral wall; and
 a barbed tab disposed between the first and second slots and having an engagement portion and a flex portion, wherein the barbed tab is adapted to penetrate the engagement hole such that the barbed tab frictionally engages the second side of the circuit board, causing a tension force on the barbed tab and simultaneously causing a compression force between a spring member and the first side of the circuit board.

17. The circuit board and cover shield assembly of claim 16, wherein the spring member is disposed adjacent the barbed tab.

18. The circuit board and cover shield assembly of claim 16, further comprising:

a notch extending through a portion of the barbed tab.

19. The circuit board and cover shield assembly of claim 16, wherein the spring member includes a bulbous distal end.

20. The circuit board and cover shield assembly of claim 16, wherein the spring member extends substantially parallel with the first side of the circuit board.

* * * * *

UNITED STATES PATENT AND TRADEMARK OFFICE
CERTIFICATE OF CORRECTION

| | | |
|---|---|---|
| PATENT NO. | : 8,724,342 B2 | Page 1 of 1 |
| APPLICATION NO. | : 13/426311 | |
| DATED | : May 13, 2014 | |
| INVENTOR(S) | : Lucas G. Schrab | |

It is certified that error appears in the above-identified patent and that said Letters Patent is hereby corrected as shown below:

In the Claims

Col. 6, claim 9, line 65, replace "first a second" with --first and second--.

Signed and Sealed this
Twenty-seventh Day of January, 2015

Michelle K. Lee
*Deputy Director of the United States Patent and Trademark Office*